United States Patent [19]

Shouen

[11] Patent Number: 5,745,371
[45] Date of Patent: Apr. 28, 1998

[54] SYSTEM AND METHOD FOR MOUNTING COMPONENTS AND LAYOUT FOR PRINTED BOARDS

[75] Inventor: Akihisa Shouen, Kawasaki, Japan

[73] Assignee: Fujitsu Limited, Kawasaki, Japan

[21] Appl. No.: 370,855

[22] Filed: Jan. 10, 1995

[30] Foreign Application Priority Data

Mar. 18, 1994 [JP] Japan .................................. 6-049472

[51] Int. Cl.$^6$ ...................................................... H05K 3/36
[52] U.S. Cl. ............................................ 364/489; 364/491
[58] Field of Search ................................. 364/488, 489, 364/490, 491, 468; 29/840; 395/125

[56] References Cited

U.S. PATENT DOCUMENTS

| | | | |
|---|---|---|---|
| 4,991,287 | 2/1991 | Piatt et al. | 29/840 |
| 5,109,479 | 4/1992 | Williams | 395/125 |
| 5,187,668 | 2/1993 | Okude et al. | 364/468 |
| 5,309,371 | 5/1994 | Shikata et al. | 364/491 |
| 5,502,644 | 3/1996 | Hamilton et al. | 364/488 |

*Primary Examiner*—Kevin J. Teska
*Assistant Examiner*—Dan Fiul
*Attorney, Agent, or Firm*—Staas & Halsey

[57] ABSTRACT

A system for mounting and designing a printed circuit board by computer aided design. A preparation unit prepares a part symbol in which logical function information indicating logical function elements and mounting information including shapes and sizes of parts are defined. A shape processing unit sets an outline frame of a printed circuit board. A displaying unit displays the outline frame of the printed circuit board which was set and displays the prepared part symbol on the screen. An arrangement designating unit inputs the logical function information in the outline frame of the printed circuit board of the screen by using the displayed part symbol and designates positions of the parts. A connection designating unit designates a wiring connection relation among each of the parts by adding logical connection information indicating a connection among each of the logical function elements to the displayed part symbol. Using this system, the logical simulation and delay analysis of the signal will be easily executed.

15 Claims, 12 Drawing Sheets

FIG. 7

| LOGICAL INFORMATION → | | SYMBOL (PARTS) | LOGICAL PIN SIGNAL | LOGICAL PIN POWER SUPPLY | LOGICAL PIN GROUND | Net | LOGICAL Wire |
|---|---|---|---|---|---|---|---|
| MOUNTING INFORMATION ↓ | | | | | | ◎ | ◎ |
| PART POSITION | BOTH SIDES LAYER | ◎ | ○ | ○ | ○ | ○ | ○ |
| PART PIN | SIGNAL | ○○ | ◎○○ | ○○○ | ○○○ | ○○○ | ○○○ |
| | POWER SUPPLY | ○ | ○ | ◎○ | ○ | ◎ | ○ |
| | GROUND | ○○ | ○○ | ○○ | ◎○ | ◎○ | ○○ |
| PART NET | BOTH SIDES LAYER | ○○ | ○○ | ○○ | ○○ | ◎◎ | ○○ |
| | INTERNAL LAYER 1 | ○ | ○ | ◎○ | ○○ | ◎○ | ○○ |
| | INTERNAL LAYER 2 | ○ | ○ | ○ | ○ | ○ | ○ |
| | POWER SUPPLY LAYER | — | — | — | — | — | — |
| | GROUND LAYER | | | | | | |
| | LEAD-THROUGH/LAYER-TO-LAYER | ◎ | | | | | |
| RELAY Via | | ○ | | | | | |
| BOARD INFORMATION | | ○ | | | | | |

SYSTEM AND METHOD FOR MOUNTING COMPONENTS AND LAYOUT FOR PRINTED BOARDS

BACKGROUND OF THE INVENTION

The present invention is related to a system for mounting and designing a printed circuit board by a computer aided design (referred to as CAD hereinafter).

Up to the present, the system for mounting and designing printed boards has been designing a logical circuit, and executing the mounting and the designing of each part corresponding to the logical circuit after that, when the printed circuit board was designed by CAD.

In this case, the system executes a library preparation processing and stores a logical function information in a logical library when the logical circuit is designed.

Further, the system prepares a logical circuit drawing by executing a logical circuit input processing on the basis of a logical function information stored in the logical library, and the system executes all kinds of logical verification processing of the logical circuit drawing.

Then, the system determines a shape of the printed circuit board, as the mounting and the designing, and executes an allocation processing of each part by using a physical information of the parts stored in a mounting library, when the result of the logical verification processing is normal.

The system prepares a part arrangement diagram by using the physical information of the parts and PCB (printed circuit board) shape information stored in the PCB shape library and executing an arrangement processing of each part, when the result of the allocation processing is normal.

Further, the system prepares a pattern diagram by using the physical information of the parts and the PCB shape information and executing a wiring pattern preparation processing, when the result of the arrangement processing is normal.

The system has analyzed a delay time and a noise of the signal, and has judged whether the printed circuit board was normal or not, when the result of the wiring pattern preparation processing was normal.

As mentioned hereinbefore, the traditional system for mounting and designing printed boards has been accomplished by executing the series of processing in order. The tolerance range of the actual value for the design value in each process of the series of processing is wide, when the printed circuit board deals with a low-speed-signal. For this reason, the manhours required to redesign the printed circuit board was small.

However, in recent years, all kinds of devices mounted with the printed circuit board are used for high-speed-processing. For this reason, a timing error of the signal and a small noise have hindered the high-speed-processing.

In this case, the system has been changing the process by returning to the wiring processing, the part arrangement processing and the logical design. For this reason, the cost increases and the product development is delayed, because the number of manhours to redesign the printed circuit board is large.

SUMMARY OF THE INVENTION

An object of the present invention is to reduce the manhours necessary for designing the printed circuit board, and to provide a low-priced system for mounting and designing printed boards.

The system for mounting and designing printed boards of the present invention designs a mounting construction of the printed circuit board by making parts corresponding to each of a plural logical function elements, which forms a logical circuit, correspond to the printed circuit board. The present invention comprises a preparation unit, a shape processing unit, a displaying unit, an arrangement designating unit and a connection designating unit.

The preparation unit prepares a part symbol in which a logical function information indicating the logical function elements and a mounting information including a shape and a size of the parts are defined on the whole. The shape processing unit sets an outline frame of the printed circuit board. The displaying unit displays the outline frame of the printed circuit board set by the shape processing unit and the part symbol prepared by the preparation unit on the screen.

The arrangement designating unit inputs the logical function information in the outline frame of the printed circuit board of the screen by using the part symbol displayed in the displaying unit, and designates positions of the parts.

The connection designating unit designates a wiring connection relation among the parts by adding a logical connection information indicating a connection among each of the logical function elements to the part symbol displayed in the displaying unit.

Further, the system for mounting and designing printed boards can be provided with a process control unit, which executes at least one of the processes of the shape processing unit, the processes of the arrangement designating unit and the processes of the connection designating unit repeatedly.

Hereupon, the shape processing unit can set a prohibition area, which prohibits the arrangement of the parts, within the outline frame of the printed circuit board displayed on the screen. The arrangement designating unit can designate a schematic arrangement range of the part symbol displayed on the screen.

Besides, the connection designating unit can designate a schematic wiring route when the wiring is restricted and can add the logical connection information to the part symbol when the wiring is not restricted.

Further, the system can be provided with a fusion database in which the logical function information, the logical connection information and the mounting information are stored by making them correspond to one another.

Further, the system can be provided with a drawing printing unit, which prepares and prints a drawing in which a logical circuit diagram and an arrangement wiring diagram are unified on the basis of the part symbol and the logical connection information.

Hereupon, the drawing printing unit can prepare a logical circuit diagram in which the arrangement and the wiring of the parts are executed following a signal flow from input to output.

Besides the preparation unit, the shape processing unit, the arrangement designation unit, the connection designating unit and the displaying unit, the fusion database and the drawing printing unit can be combined alternatively.

Then, a method for mounting and designing printed boards of the present invention designs a mounting construction of a printed circuit board by making parts corresponding to each of a plural logical function elements, which forms a logical circuit correspond to the printed circuit board. The present invention comprises a preparation step, a shape processing step, an arrangement designation step and a connection designating step.

The preparation step prepares a part symbol in which a logical function information indicating the logical function elements and a mounting information including a shape and a size of the parts are defined on the whole.

The shape processing step sets an outline frame of the printed circuit board. The displaying step displays the outline frame of the printed circuit board, which was set and the prepared part symbol on the screen.

The arrangement designating step inputs the logical function information in the outline frame of the printed circuit board of the screen by using the displayed part symbol and designates positions of the parts.

The connection designating step designates a wiring connection relation among the parts by adding a logical connection information indicating a connection among each of the logical function elements to the displayed part symbol.

Besides, the order of the preparation step and the shape processing step can be reversed. The order of the arrangement designating step and the connection designating step also can be reversed.

Further, the method for mounting and designing printed boards can be provided with a process control step which executes at least one of the processes of the shape processing step, the processes of the arrangement designating step and the processes of the connection designating step repeatedly.

Hereupon, the shape processing step can set a prohibition area which prohibits the arrangement of the parts within the outline frame of the printed circuit board displayed on the screen. The arrangement designation step can designate a schematic arrangement range of the part symbol displayed on the screen.

Besides, the connection designating step can designate a schematic wiring route when the wiring is restricted and can add the logical connection information to the part symbol when the wiring is not restricted.

Further, the method can be provided with a storage step which stores the logical function information, the logical connection information and the mounting information by making them correspond to one another.

Moreover, the method can be provided with a drawing printing step which prepares and prints a drawing in which a logical circuit diagram and an arrangement wiring diagram are unified on the basis of the part symbol and the logical connection information.

The drawing printing step can prepare a logical circuit diagram in which the arrangement and the wiring of the parts are executed following a signal flow from input to output.

The preparation unit prepares the part symbol in which the logical function information and the mounting information are defined on the whole, and the shape processing unit sets the outline frame of the printed circuit board.

The arrangement designating unit inputs the logical function information in the outline frame of the printed circuit board of the screen by using the part symbol and designates the positions of the parts. The connection designating unit designates the wiring connection relation among each of the parts by adding the logical connection information to the part symbol.

Namely, the logical design and the part mounting using the part symbols are executed simultaneously in the outline frame of the printed circuit board. Besides, the wiring route among the parts will be designated at the same time if the logical connection information is added to the part symbol.

Accordingly, the design manhours of the printed circuit board can be reduced, since the mounting of the parts is executed simultaneously from the logical design stage. The arrangement of the parts and the shape of the printed circuit board will be changed dynamically in the actual size, if the shape processing, the logical input, the part arrangement processing and the wiring processing of the printed circuit boards are executed for the second time as occasion demands. For this reason, the material grasp of the mounted parts and the changing of the shape can be executed.

The prohibition area is set within the outline frame of the printed circuit board, and the schematic arrangement range of the part symbol is designated. Accordingly, the delay condition of the signal can be confirmed in its early stage, since the arrangement of the parts is executed step by step from the early stage of the design.

Besides, the delay condition of the signal can be confirmed in its early stage complying with the wiring pattern shape, since the connection designating unit designates the wiring pattern shape step by step.

The logical information and the mounting information can be retrieved at a high speed, because the fusion database stores the logical information and the mounting information by making them correspond to one another. The information management accompanying the changing of the logical design will be easily executed, because the drawing printing unit prints the drawing in which the logical circuit diagram and the arrangement wiring diagram are unified.

The logical simulation and the delay analysis of the signal will be easily executed, because the drawing printing unit prepares the logical circuit diagram in which the arrangement and the wiring of the parts are executed following a signal flow from input to output.

BRIEF DESCRIPTION OF THE DRAWINGS

FIG. 7 is a table correlation diagram of the fusion database of the embodiment 3.

DETAILED DESCRIPTION OF THE PREFERRED EMBODIMENT

Figure 1:
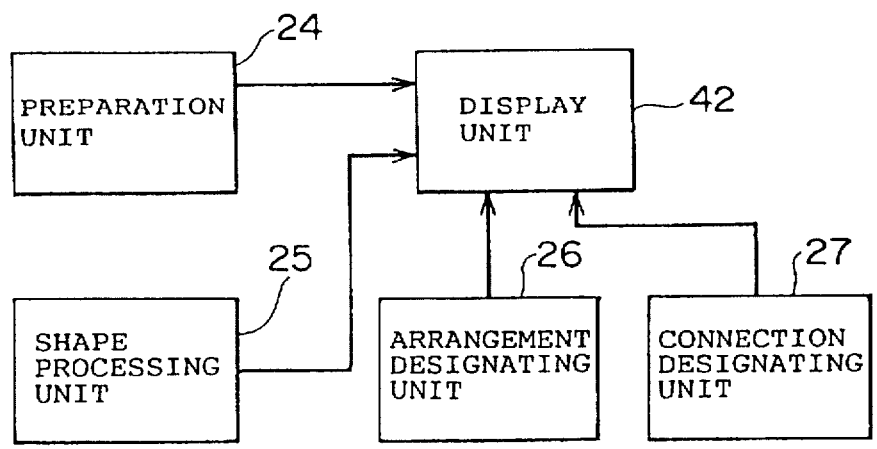
FIG. 1 is a construction block diagram indicating a system for mounting and designing printed boards according to the embodiment 1 of the present invention.

The embodiments of the present invention will be described by referring to the drawings as follows.

The system for mounting and designing printed boards of the present invention designs a mounting construction by making parts corresponding to each of a plural logical function elements which forms a logical circuit correspond to the printed circuit board.

The system for mounting and designing printed boards reduces the design manhours of the printed circuit boards by executing the logical design and the mounting of the parts simultaneously. FIG. 1 is a construction block diagram indicating the system for mounting and designing printed boards according to the first embodiment.

The system for mounting and designing printed boards comprises a preparation unit 24, a shape processing unit 25, a displaying unit 42, an arrangement designating unit 26, and a connection designating unit 27. The preparation unit 24, the shape processing unit 25, the arrangement designating unit 26 and the connection designating unit 27 are connected to the displaying unit 42.

The preparation unit 24 prepares a part symbol in which a logical function information indicating the logical function elements and a mounting information including a shape and a size of the parts are defined on the whole. The shape processing unit 25 sets the outline frame of the printed circuit board on the screen.

The displaying unit 42 displays the outline frame of the printed circuit board set by the shape processing unit 25 and the part symbol prepared by the preparation unit 24 on the screen. The displaying unit 42 is a cathode ray tube (CRT) or a liquid-crystal display and so on.

The arrangement designating unit 26 inputs the logical function information in the outline frame of the printed circuit board of the screen by using the part symbol displayed in the displaying unit 42, at the same time, designates positions of the parts.

The connection designating unit 27 designates a wiring connection relation among the parts by adding a logical connection information indicating a connection among each of the logical function elements to the part symbol displayed in the displaying unit 42.

The preparation unit 24, the shape processing unit 25, the arrangement designating unit 26 and the connection designating unit 27 are the functions realized, for instance, in case that the central processing unit (CPU) executes the program stored in the memory. Besides, the system can be provided with an unillustrated input unit, which inputs the logical function information and the mounting information.

Figure 2:
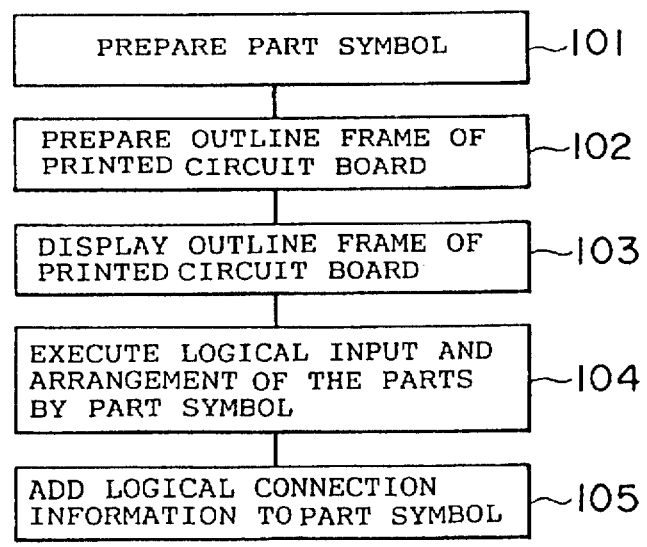
FIG. 2 is a flowchart indicating a method for mounting and designing printed boards according to the embodiment 1 of the present invention.

Then, the method for mounting and designing printed boards according to the embodiment 1 of the present invention will be described by referring to FIG. 2.

The preparation unit 24 prepares a part symbol in which a logical function information indicating the logical function elements and a mounting information including a shape and a size of the parts are defined on the whole (Step 101). The shape processing unit 25 sets an outline frame of the printed circuit board (Step 102).

The displaying unit 42 displays the outline frame of the printed circuit board which was set and the prepared part symbol on the screen (Step 103).

The arrangement designation unit 26 inputs the logical function information in the outline frame of the printed circuit board of the screen by using the displayed part symbol and designates positions of the parts (Step 104).

The connection designating unit 27 designates a wiring connection relation among the parts by adding a logical connection information indicating a connection among each of the logical function elements to the displayed part symbol (Step 105).

Namely, the logical design and the mounting of the parts by using the part symbol are executed simultaneously within the outline frame of the printed circuit board. Besides, the wiring route among the parts will be designated at the same time if the logical connection information is added to the part symbol.

Accordingly, the design manhours of the printed circuit board can be reduced because the mounting of the parts is executed simultaneously from the logical design stage.

Further, the order in which the process of the preparation unit 24 and the process of the shape processing unit 25 are executed can be reversed. The order in which the process of the arrangement designating unit 26 and the process of the connection designating unit 27 are executed can also be reversed.

Figure 3:
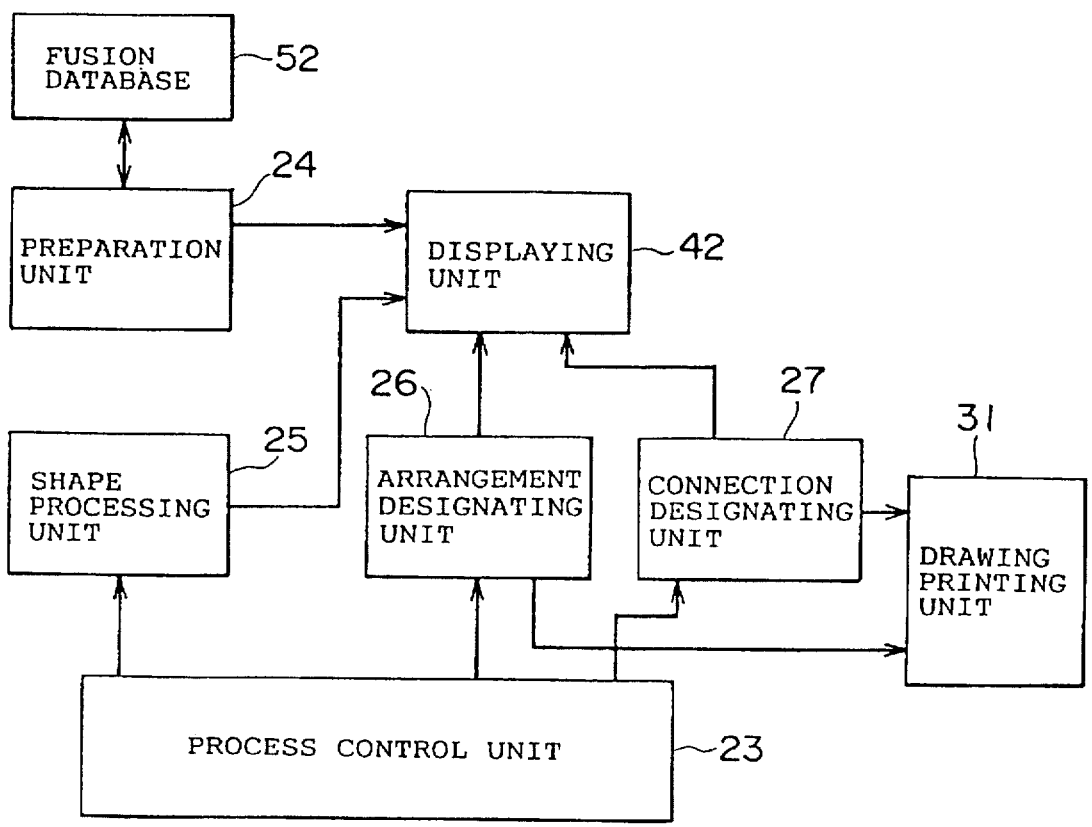
FIG. 3 is a construction block diagram indicating a system for mounting and designing printed boards according to the embodiment 2 of the present invention.

The second embodiment of the present invention is described below. FIG. 3 is a construction block diagram indicating the system for mounting and designing printed boards of the present invention according to the second embodiment. The system of the second embodiment comprises the preparation unit 24, the shape processing unit 25, the displaying unit 42, the arrangement designating unit 26 and the connection designating unit 27. Moreover, the system comprises a process control unit 23, a fusion database 52 and a drawing printing unit 31.

The process control unit 23 is connected to the shape processing unit 25, the arrangement designating unit 26 and the connection designating unit 27. The process control unit 23 executes at least one of the processes of the shape processing unit 25, the processes of the arrangement designating unit 26 and the processes of the connection designating unit 27 repeatedly.

The process control unit 23 is the function realized in case that the central processing unit executes the program stored in the memory. The fusion database 52 is connected to the preparation unit 24, and stores the logical function information, the logical connection information and the mounting information by making them correspond one another.

The drawing printing unit 31 is connected to the arrangement designating unit 26 and the connection designating unit 27. The drawing printing unit 31 prepares and prints a drawing in which a logical circuit diagram and an arrangement wiring diagram of the parts are unified on the basis of the part symbol and the logical connection information. Besides, the drawing printing unit 31 prepares the logical circuit diagram in which the arrangement and the wiring of the parts are executed following the signal flow from the input to the output.

Figure 4:
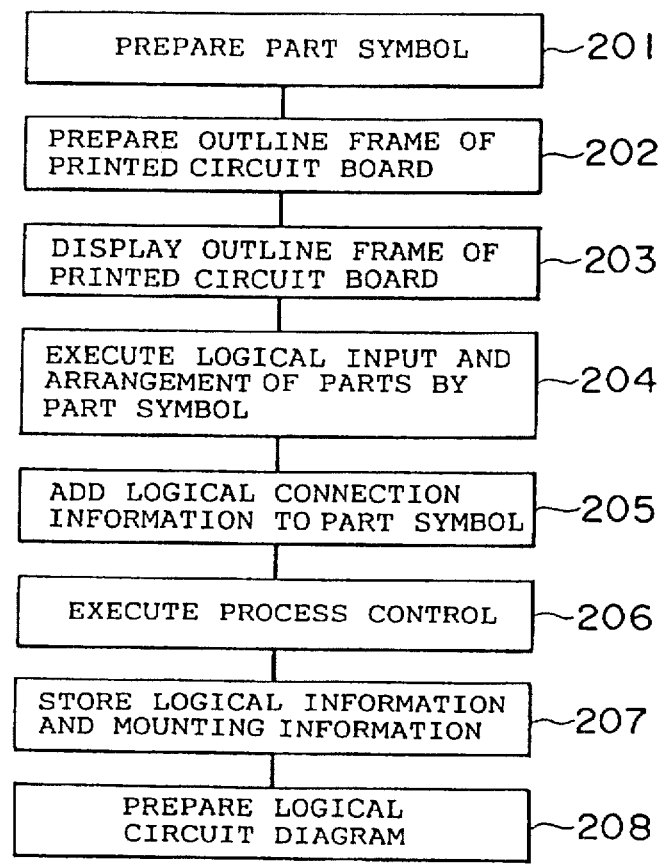
FIG. 4 is a flowchart indicating a method for mounting and designing printed boards according to the embodiment 2 of the present invention.

Then, the method for mounting and designing printed boards according to the embodiment 2 of the present invention will be described by referring to FIG. 4.

The preparation unit 24 prepares a part symbol in which a logical function information indicating the logical function elements and a mounting information including a shape and a size of the parts are defined on the whole (Step 201). The shape processing unit 25 sets an outline frame of the printed circuit board (202).

The displaying unit 42 displays the outline frame of the printed circuit board which was set and the prepared part symbol on the screen (Step 203).

The arrangement designating unit 26 inputs the logical function information in the outline frame of the printed circuit board of the screen by using the displayed part symbol, and designates positions of the parts (204).

The connection designating unit 27 designates a wiring connection relation among each of the parts by adding a logical connection information indicating a connection among each of the logical function elements to the displayed part symbol (205).

The process control unit 23 executes at least one of the processes of the shape processing unit 25, the processes of the arrangement designating unit 26 and the processes of the connection designating unit 27 repeatedly (Step 206).

The fusion database 52 stores the logical function information, the logical connection information and the mounting information by making them correspond one another (Step 207).

The drawing printing unit 31 prepares and prints a drawing in which a logical circuit diagram and an arrangement wiring diagram are unified on the basis of the part symbol and the logical connection information. The drawing printing unit 31 prepares a logical circuit diagram in which the arrangement and the wiring of the parts are executed following the signal flow from the input to the output (Step 208).

As mentioned hereinbefore, the arrangement of the parts and the shape of the printed circuit board will be changed dynamically in the actual size, since the shape processing, the logical input, part arrangement and the wiring processing of the printed circuit board are executed for the second time as occasion demands. Accordingly, such complicated design changes as the material grasp of the mounted parts and the changing of the shape can be executed.

Further, the logical information and the mounting information can be retrieved at a high speed, since the fusion database 52 stores the logical information and the mounting information by making them correspond one another.

Moreover, the information management accompanying the logical design can be easily executed, since the drawing printing unit 31 prints a drawing in which a logical circuit diagram and an arrangement wiring diagram are unified. And the logical simulation and the delay analysis of the signal can be easily executed, since the drawing printing unit 31 prepares a logical circuit diagram in which the arrangement and the wiring of the signal are executed following the signal flow from the input to the output.

Figure 5:
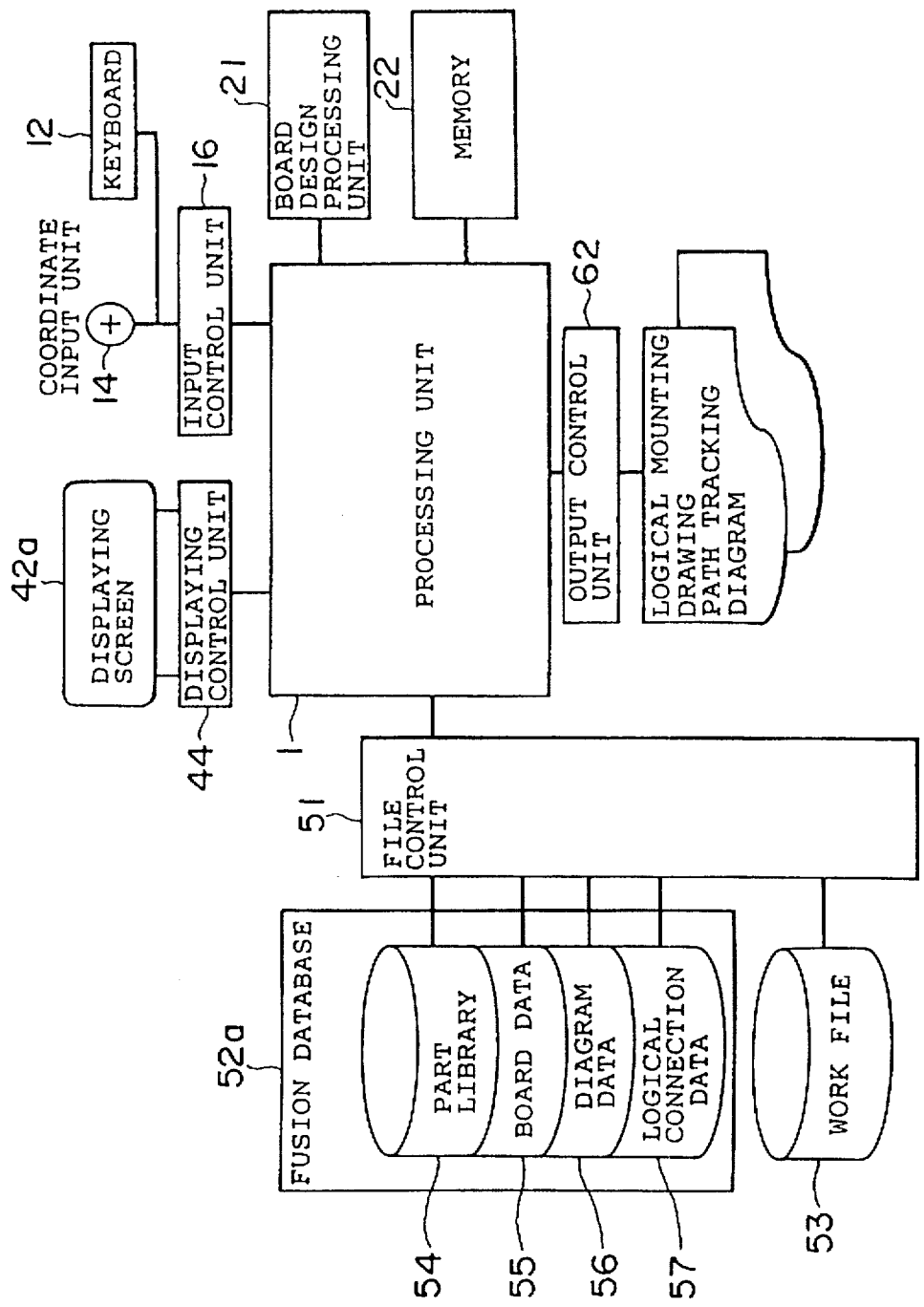
FIG. 5 is a construction block diagram indicating a system for mounting and designing printed boards according to the embodiment 3 of the present invention.

The third embodiment of the present invention is described below. FIG. 5 is a block diagram indicating a construction according to the third embodiment of the system for mounting and designing printed boards of the present invention. The system for mounting and designing printed boards designs a mounting construction of a printed circuit board by making the parts corresponding to each of the plural logical function elements which forms a logical circuit correspond to the printed circuit board. The system for mounting and designing printed boards is provided with a processing unit 1 consisting of a microprocessor and so on.

An input control unit 16, a display control unit 44, a board design processing unit 21, a memory 22, an output control unit 62 and a file control unit 51 are connected to the processing unit 1. The processing unit 1 processes the all kinds of information by controlling each of the units.

A keyboard 12 and a coordinate input unit 14 are connected to the input control unit 16, a displaying unit 42a is connected to the displaying control unit 44, and a fusion database 52a and a work file 53 are connected to the file control unit 51.

The keyboard 12 inputs such logical information as a logical function information (a logical function name) indicating the logical function elements, a net name (a signal name) indicating a logical connection information which connects each of the logical function elements one another and a check information. The keyboard 12 also inputs such limit information as a prohibition area which prohibits an arrangement and a wiring of the parts within the detailed printed circuit board.

The coordinate input unit 14 inputs the outline frame information of the printed circuit board and such graphic information as the actual size, shape and the pin arrangement of the parts. For instance, the coordinate input unit 14 is a mouse.

The input control unit 16 is an interface and transmits the information input from the keyboard 12 or the coordinate input unit 14 to the processing unit 1.

The memory 22 stores a plurality of processing programs for designing the printed circuit boards. The board design processing unit 21 is a function realized in case that the processing unit 1, which input the information executes the plural processing programs for designing the boards stored in the memory 22.

The file control unit 51 controls the fusion database 52a and the work file 53. The output control unit 62 outputs a logical mounting drawing data obtained by the board design processing unit 21 and a tracking pass data of the signal to the printing unit.

Figure 6:
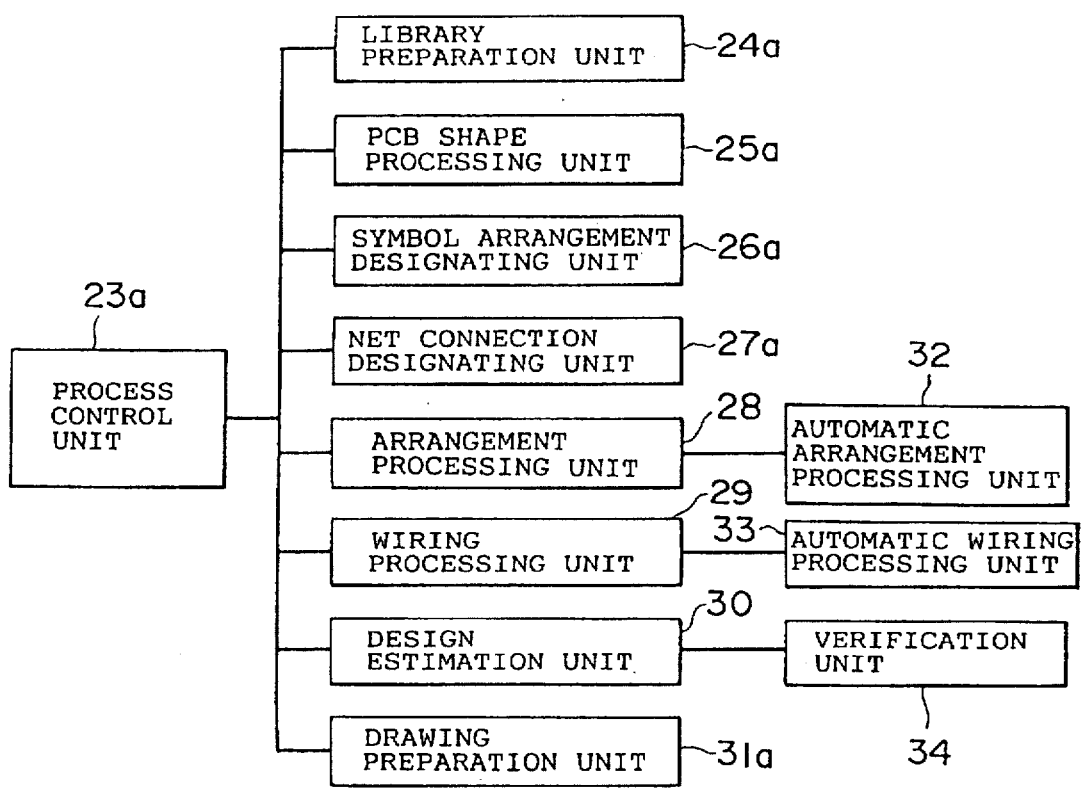
FIG. 6 is a construction block diagram indicating a board design processing unit of the embodiment 3.

FIG. 6 is a construction block diagram indicating the board design processing unit 21. The board design processing unit 21 has a process control unit 23a. The library preparation unit 24a, the PCB shape processing unit 25a, the symbol arrangement designating unit 26a and the net connection designating unit 27a are connected to the process control unit 23a. The arrangement processing unit 28, the wiring processing unit 29, the design estimation unit 30, and the drawing preparation unit 31a are connected to the process control unit 23a.

An automatic arrangement processing unit 32 is connected to the arrangement processing unit 28. An automatic wiring processing unit 33 is connected to the wiring processing unit 29. A verification unit 34 is connected to the design estimation unit 30. The process control unit 23a controls each processing of the units corresponding to the program.

The library preparation unit 24a prepares a part symbol in which a logical function information indicating the logical function elements and a physical information including a shape and a size of the parts are defined on the whole. The PCB shape processing unit 25a sets an outline frame of the printed circuit board.

The displaying unit 42a displays the outline frame of the printed circuit board set by the PCB shape processing unit 25a, and the part symbol prepared by the library preparation unit 24a on the screen.

The symbol arrangement designating unit 26a inputs the logical function information in the outline frame of the printed circuit board of the screen by using the part symbol displayed in the displaying unit 42a and designates positions of the parts.

The net connection designating unit 27a designates a wiring connection relation among each of the parts by adding the logical connection information indicating the connection among each of the logical function elements to the part symbol displayed in the displaying unit 42a.

The arrangement processing unit 28 executes the changing process of the arrangement of the parts by the conversational operation. The automatic arrangement processing unit 32 considers the whole connection relation, and arranges a not yet arranged part which will be an object in most suitable condition, in order to equalize the wiring density and minimize the total prediction wiring length.

The wiring processing unit 29 sets such detailed manufacturing conditions as the clearance condition of the wiring pattern. The automatic wiring processing unit 33 executes the automatic wiring of the priority wiring on the basis of the logical connection information, and executes the automatic wiring of each layer by the equalization of the wiring density and the layer division designation, when the route can be wired freely. The design estimation unit 30 estimates each of the processes which was executed in order from the PCB shape processing to the automatic wiring processing.

The drawing printing unit 31 represents a short-distance-wiring which is wired on the both sides of the printed circuit board in full lines which are clear enough to be observed visually. The drawing printing unit 31 represents a trunk line which will be a representation in such flux wiring as the bus in thick lines, and the drawing printing unit 31 represents the number of fluxes and the net name simultaneously.

The verification unit 34 executes the analysis of a logical simulation, a delay of the signal and a crosstalk noise.

The fusion database 52 stores the all informations efficiently in the logical processing and the mounting processing of a part library information, a print circuit board information, a net connection information, and a wiring pattern information and so on.

As shown in the table correlation diagram of FIG. 7, the table of the fusion database 52a makes the mounting information and the logical information correspond to one another. As shown in FIG. 7, the mounting information consists of the information of a part position, a part pin, a part net and a relay via. The logical information consists of the information of a symbol, a logical pin, a logical net and a logical wire.

Each of the mounting information correspond to each of the logical information. Each of the part pins and the logical pins is divided into the pin for the signal, the power supply and the ground. The part nets are divided into the net for the both sides layer, the internal layer, the power supply layer, and the ground layer.

Hereupon, the portions marked with double circle indicate that the frequency that the information is referred to is high. The portions marked with a single circle indicate that the frequency that the information is referred to is intermediate. "–" indicates a simple retrieval in which no linkage exists between the logical information and the mounting information. "×" indicates that it is impossible to refer to the information.

Figure 8:
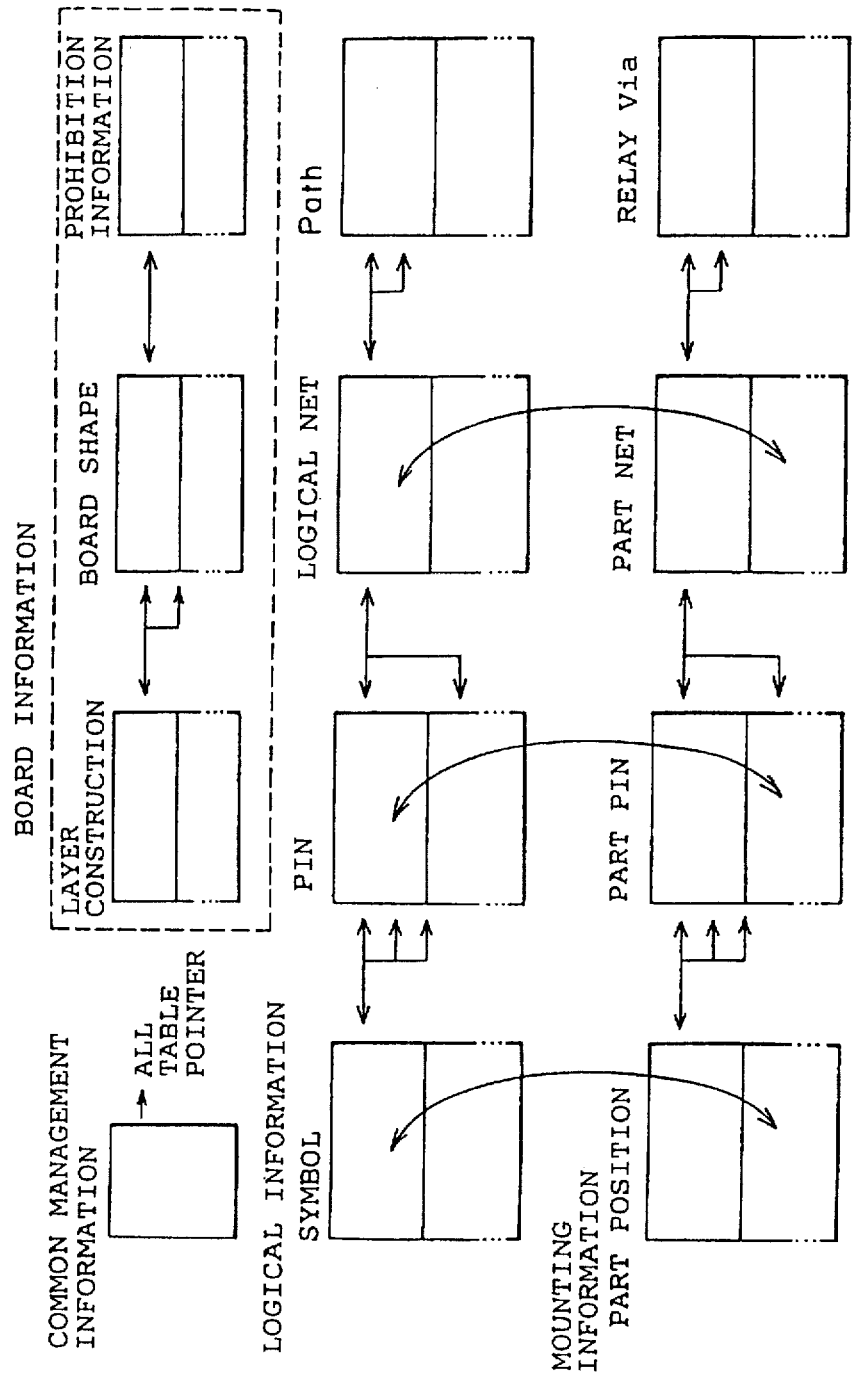
FIG. 8 is a diagram indicating a table link of the embodiment 3.

Besides, the common management information which is common to the logical information and the mounting information is structured hierarchically in the table link shown in FIG. 8. The layer construction is arranged in the lower layer of the common management information, the board shape is arranged in the lower layer of the layer construction and the prohibition information is arranged in the lower layer of the board shape. The logical information symbol is structured hierarchically. The pin is arranged in the lower layer of the symbol, the logical net is arranged in the lower layer of the pin and the pass is arranged in the lower layer of the logical net.

The position of the mounting information part is structured hierarchically. The part pin is arranged in the lower layer of the mounting information part, the part net is arranged in the lower layer of the part pin and the relay via is arranged in the lower layer of the part net.

Figure 9:
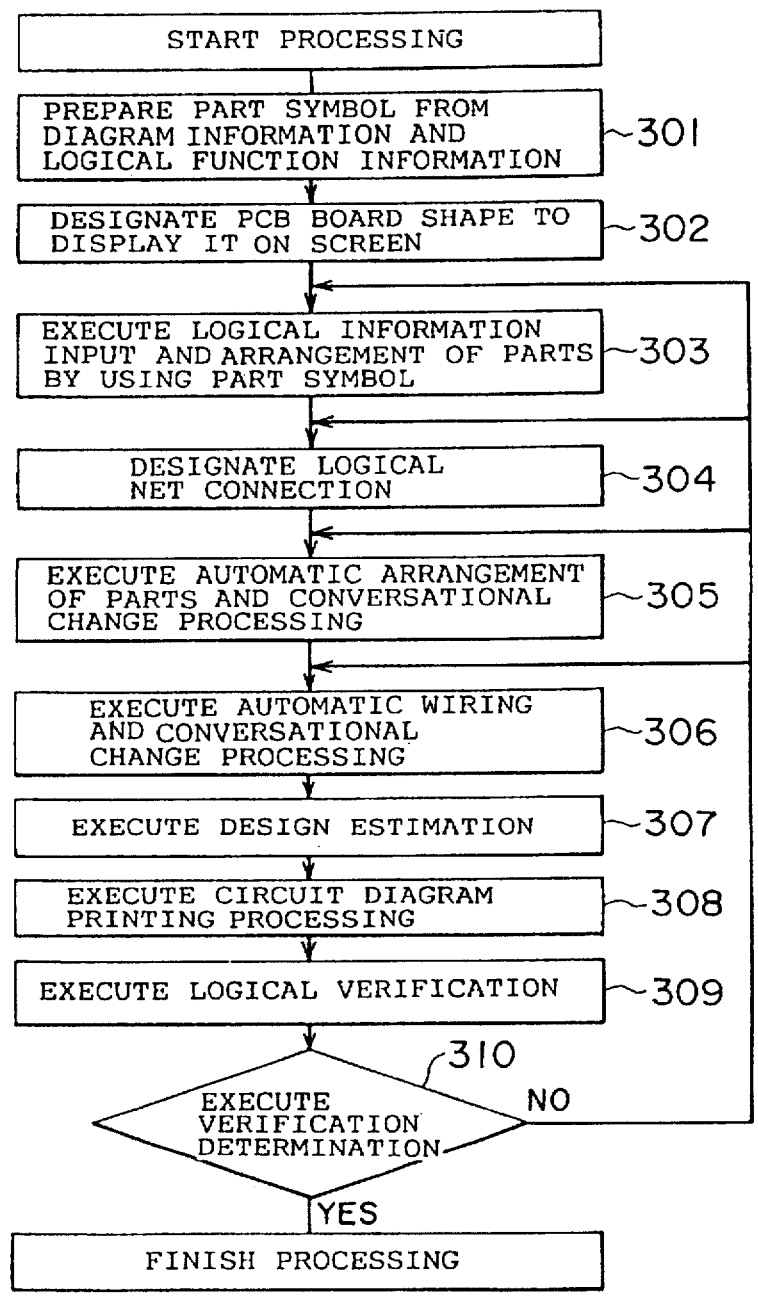
FIG. 9 is a flowchart indicating a method for mounting and designing printed boards according to the embodiment 3.

Then, the method for mounting and designing printed boards of the embodiment 3 will be described. FIG. 9 is a flowchart indicating the method for mounting and designing printed boards. Each process will be described as follows.

(1) Library Preparation Processing

First, the coordinate input unit 14 inputs such diagram information as the actual size and the shape and the pin arrangement. The keyboard 12 inputs such logical information as a logical function name (a logical function information), a signal name and a check information. The diagram information from the coordinate input unit 14 and the logical information from the keyboard 12 are outputted to the board design processing unit 21 through the input control unit 16 and the processing unit 1.

Figure 10:
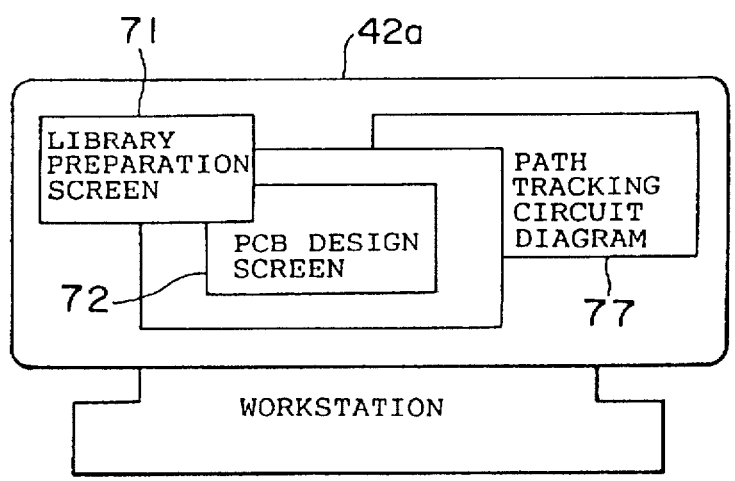
FIG. 10 is a diagram indicating a display device of the embodiment 3.

Then, the library preparation unit 23a prepares a part symbol as a library in which such physical information as the shape of the part and the position of the pin and the logical function information are defined by the conversational operation on the basis of the diagram information and the logical information from the coordinate input unit 14 and the keyboard 12(Step 301). The processing result by the library preparation unit 24a is displayed legibly on the library preparation screen 71 of the displaying unit 42a shown in FIG. 10.

Figure 11:
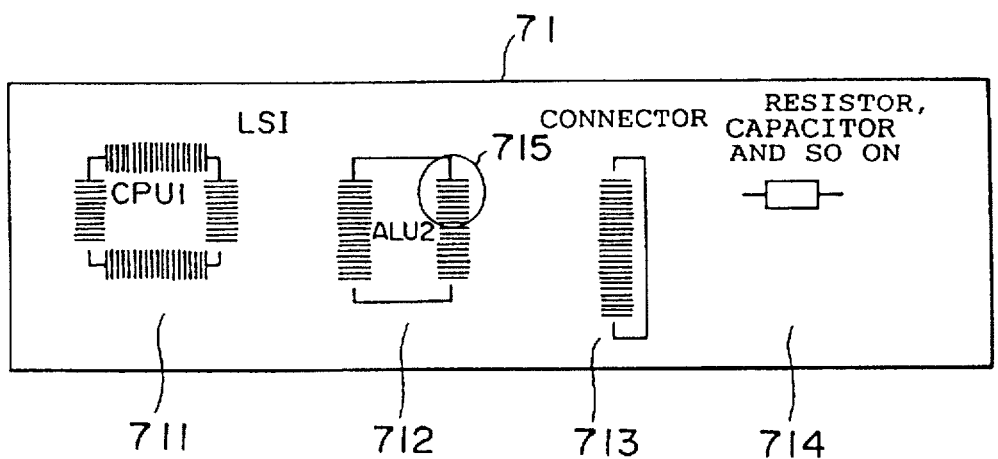
FIG. 11 is a diagram indicating the part symbol on the library preparation screen of the embodiment 3.

The detail of the library preparation screen 71 is shown in FIG. 11. In FIG. 11, the library preparation screen 71 displays the part symbols of CPU 711, ALU (Arithemetic Logic Unit) 712, a connector 713, a resistor or a capacitor 714. By these actions, the part symbol in which the logical information and the mounting information are unified will be prepared.

Further, the processing result will be corrected by the conversational operation if the correction is needed for the processing result. Then, the fundamental part symbol is registered at the part library 54 of the fusion database 52a.

(2) PCB Shape Processing

Then, the coordinate input unit 14 inputs the detailed outline-frame-information of the printed circuit board which is regarded as an object. Whereupon, the PCB shape processing unit 25a processes the outline frame information of the printed circuit board by the conversational operation.

The PCB shape processing unit 25a defines the outline frame of the PCB by displaying the outline-frame-information of the boards on the PCB design screen 72 of the displaying unit 42a (Step 302). The processing result is registered to the fusion database 52a as a board data 55.

The keyboard 12 inputs such limit information as the prohibition area in which the arrangement and the wiring of the parts are prohibited within the detailed printed circuit boards. The PCB shape processing unit 25a processes the limit information by the conversational operation.

The processing result of the limit information is added as the board data 55. The PCB shape processing unit 25a sets up a prohibition area 721 as a limit information, for instance, on the PCB design screen 72 shown in FIG. 12.

Figure 13:
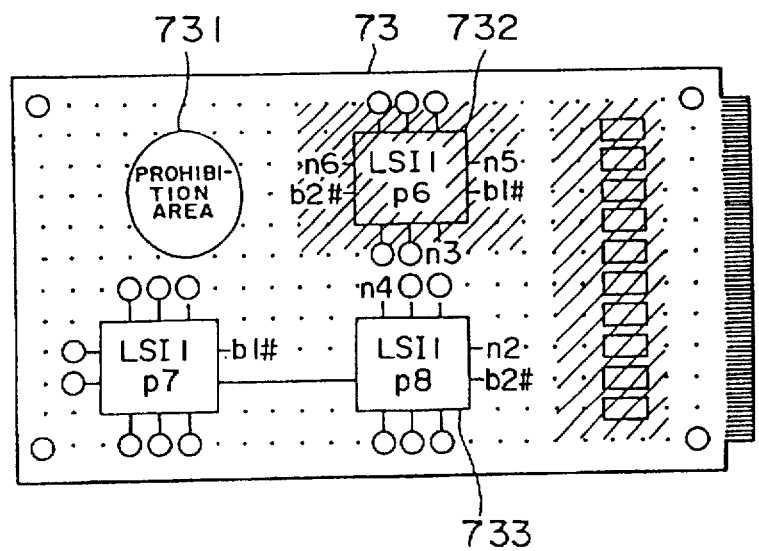
FIG. 13 is a diagram indicating the PCB rear face mounting circuit diagram of the embodiment 3.

The PCB shape processing unit 25a defines a new PCB design screen 73 for the reverse side, for instance, from the external form of the reverse side as shown in FIG. 13, and defines the prohibition area 731 of the reverse side, when the parts are mounted on the both sides of the printed circuit board.

Further, the PCB shape processing unit 25a can designate the number of the wiring layers, the grid interval and the minimum wiring width as occasion demands, when the printed circuit board is made up of the plural layers. Moreover, the processing can be continued even if such information as the detailed shape of the parts is not determined. In this case, the detailed shape should be designated until the wiring preparation processing is executed.

(3) Logical Input and Part Arrangement Processing

The coordinate input unit 14 moves at the prescribed quantity so as to arrange the part symbol on the designated position of the screen. The part symbol arrangement designating unit 26a moves the part symbol prepared by the library preparation unit 24a within the PCB outline frame of the displaying screen, as the coordinate input unit 14 moves at the prescribed quantity.

The part symbol arrangement designation unit 26a inputs the logical function information as the logical design and designates the position of the parts, as the part symbol moves (Step 303). The result is stored at the fusion database 52a as a diagram data 56.

Further, the coordinate input unit 14 designates the latitude in which the parts can be moved by moving at the prescribed quantity, when the degree of freedom exists in relation to the arrangement of the parts. The part symbol arrangement unit 26a designates the degree of freedom of the part position, when the part symbol is added to the PCB external form by the conversational form, as the coordinate input unit 14 moves at the prescribed quantity.

Figure 12:
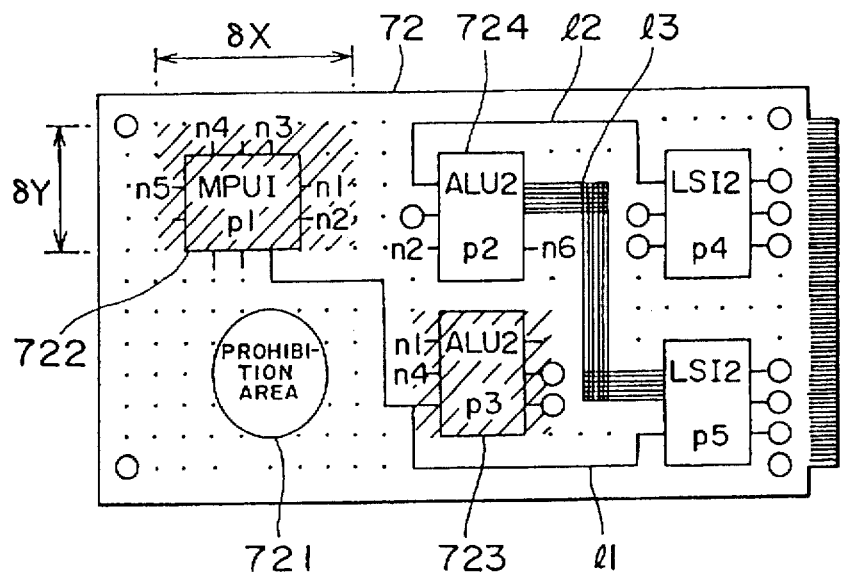
FIG. 12 is a diagram indicating the PCB front face mounting circuit diagram of the embodiment 3.

As shown in the half-tone dot meshing parts of FIG. 12, the latitude in which the parts can be moved is, for instance, δ y longitudinally and δ x horizontally. In the example shown in FIG. 12, MPU 722 and ALU 723 can be moved within the half-tone dot meshing parts.

As mentioned hereinbefore, the parts in which the position should not be determined in advance before the wiring is designed can be arranged even after the major wiring is decided, by letting it have previously the degree of freedom as the position indeterminate parts.

(4) Net Connection Designating Processing

Then, the logical net connection among the arranged parts is executed. In this case, the connection designation among the parts can be made to correspond by granting the net name to the symbol pin. Namely, the net connection designating unit 27a makes the logical connection and the wiring connection among the parts correspond one another by granting the net name which is the logical connection information from the keyboard 12 to the part symbol pin, when the general net logical connection in which the wiring pattern shape and the length are not restricted is executed (Step 304).

As a result, for instance, the net names n 1–n 5 are added to each pin of the MPU 722 as shown in FIG. 12. The net names n 1 and n 4 are added to the pins of the ALU 723, and the net names n 2 and n 6 are added to the pins of the ALU 724.

Hereupon, the pins for the identical net names are connected one another. Then, the processing result is stored to the fusion database 52a as the logical connection data 57.

Figure 14:
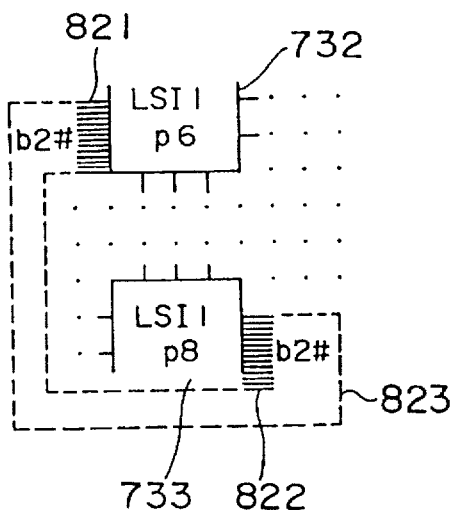
FIG. 14 is a diagram indicating a designation example of a line route of the embodiment 3.

Hereupon, the net connection designating unit 27a also can make the logical connections correspond one another by granting the net name consisting of only the representative-trunk-line-name to the flux wiring of the bus wiring in which the wiring route is not restricted. For instance, as shown in FIG. 14, only the representative-trunk-line-name b2# is added to the bus wiring 821 of LSI 732 and the bus wiring 822 of LSI 733. By these actions, the logical connections can be made correspond one another.

In this case, as shown in FIG. 14, the latitude 823 is designated for the route to be wired. The wiring in which the route is not particularly limited is determined by the automatic wiring processing after the parts are arranged.

On the other hand, the coordinate input unit 14 inputs the wiring route by moving at the prescribed quantity when the wiring is restricted. The net connection designating unit 27a designates the schematic wiring route as the coordinate input unit 14 moves at the prescribed quantity. For instance, the priority wiring 1 1, the thick line wiring 1 2, the flux wiring 1 3 and the equal-length balanced wiring shown in FIG. 12 are designated, when the wiring route and the wiring width are designated in detail. The result is stored at the fusion database 52a as a logical connection data 57.

Further, the limit terms of a parallel wiring, a line wiring and a designated-length wiring are also added as a special automatic wiring condition at the same time.

(5) Both Sides Mounting Processing

Hereupon, the arrangement processing (3) and the wiring processing (4) are also executed in relation to the logical design of the reverse side of the board, when the parts are mounted to the both sides of the printed circuit board. In this case, the PCB shape processing unit 25a designates the reverse side shape of the PCB.

For instance, as shown in FIG. 13, the PCB shape processing unit 25a displays a new PCB design screen 73 on the screen. The part symbol arrangement designating unit 26a executes the arrangement processing (3).

The net connection designating unit 27a executes the wiring processing (4). In the example shown in FIG. 13, the net names n 5, n 6 and the representative-trunk-line-names b1#, b2# are added to the LSI 732.

In this case, the displaying unit 42a displays the both sides of the printed circuit board by the radioscopy, when the both-sides-external-forms of the printed circuit board should be displayed simultaneously on the screen. The operator should execute the work checking the both sides.

Besides, the displaying unit 42a displays each layer or the related layer of the internal layers dedicated to the wiring in the multi-layer printed circuit board at the same time. The wiring route designation of each layer can be executed by the displaying. Further, the displaying unit 42a displays the prohibition information which influences the relay via (through-hole) penetrating the all layers and the internal layer wiring simultaneously by the radioscopy in relation to the related layers. By these actions, the operator can execute the work efficiently.

(6) Part Arrangement Processing

The logical design is ended by the arrangement processing (3) and the wiring processing (4). Then, the arrangement processing unit 28 executes the change processing of the arrangement of the parts by the conversational operation. The part arrangement in which some automation is used at the same time by the human visual judgement also can be executed in the conversational operation.

The automatic arrangement processing unit 32 considers the whole connection relation, and arranges the not yet arranged parts which will be a object of the automatic arrangement in most suitable condition, in order to equalize the wiring density and minimize the total prediction wiring length (Step 305).

Especially, the automatic arrangement processing unit 32 selects the most suitable value by controlling the cost of the wiring which passes through the center of PCB and the cost of the wiring which passes around PCB, and by controlling the cost according to the deference of elevation of the pin-density-distribution repeatedly, in order to plan the equalization of the important wiring density.

The parts whose external form is big and the parts whose shape is complicated can be changed manually, or the position of the parts can be determined by the semiautomatic processing. The arrangement should be changed in the stage in which the wiring is determined to some extent, since the parts whose external form is small have a big degree of freedom of the arrangement.

(7) Wiring Processing

Then, the wiring-pattern-preparation-processing will be executed. The wiring processing unit 29 sets the detailed manufacturing conditions of the clearance conditions of the wiring pattern. The automatic wiring processing unit 33 executes the automatic wiring of the priority wiring on the basis of the route designation information.

The automatic wiring processing unit 33 executes the automatic wiring of each layer by the equalization of the wiring density and the layer division designation when the route is wired freely (Step 306).

Figure 15:
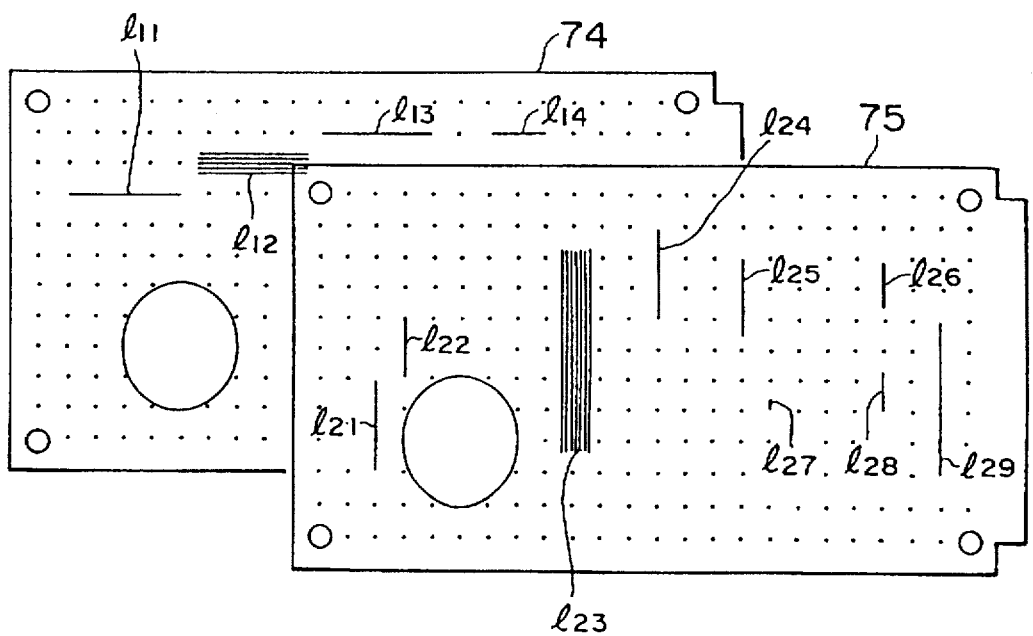
FIG. 15 is a diagram indicating the PCB internal layer wiring pattern of the embodiment 3.

The automatic wiring processing unit 33 executes the wiring by considering the equalization of the wiring density and the minimization of the number of the layer-to-layer relay through-holes at the same time. For instance, in the example shown in FIG. 15, the wiring 1 11–1 14 are wired to the internal layer 74, the wiring 1 21–1 29 are wired to the inside layer 75.

Besides, the wiring patterns should be determined by the automation and the manual operation similarly in relation to the unwired portions. The part which is in the way and the parts whose arrangement is free should be handled as the arrangement adjustment parts, when it is difficult to execute the complete wiring.

The arrangement adjustment parts are rearranged in a vacant location through which the wiring pattern does not pass, when the parts still remain after the wiring is completed. At this moment, the necessary leading lines are added.

For instance, the solid parts and the chip resistance which are mounted stepping over the wiring patterns are the parts whose size is small and whose degree of freedom of the arrangement is high. These parts are arranged in the vacant location by the arrangement processing unit 28, after the wiring pattern is determined.

Further, there are some cases that the wiring can be executed by changing the position of the parts, even if the wiring can not be executed in the automatic wiring design. In this case, the automatic wiring processing unit 33 or the wiring processing unit 29 by the conversational operation should be corrected by moving the wiring.

(8) Design Estimation

As mentioned hereinbefore, generally, each processing from the PCB shape processing to the automatic wiring processing is executed in order as a processing of the PCB design. The result of the processing is estimated by the design estimation unit 30 (Step 307). Hereupon, the process control unit 23a executes each processing from the PCB shape processing to the automatic wiring processing repeatedly in irregular order as occasion demands, in order to improve the processing result.

(9) Storing of Design Information

The design information determined by the above-mentioned processing is stored in the fusion database 52a. In this case, as shown in the correlation diagram of FIG. 7, the mounting information and the logical information are stored in the table of the fusion database 52a by making them correspond one another.

Besides, as shown in FIG. 8, the related tables are made correlate efficiently. The information can be retrieved in a moment, since the all kinds of important tables of the logical information and the mounting information is constructed so as to be referred to at a high speed. Accordingly, the processing can be executed efficiently.

Moreover, the verification unit 34 can execute such logical verifications as the logical simulation by the part symbol position and the logical connection information stored in the fusion database 52a before the wiring. The verification unit 34 can execute the schematic verification of the signal delay by the virtual line length calculated in the design estimation unit 30. The logical design can be changed by the verification result.

(10) Drawing Printing Processing

The drawing printing unit 31 represents a short-distance-wiring which is wired on the both sides of the printed circuit board in full lines which are clear enough to be observed visually. The drawing printing unit 31 thick-line-displays such flux lines as the bus in trunk lines which will be a representation and represents the number of the fluxes and the name of the net simultaneously.

The drawing printing unit 31 represents the connection relation by displaying the name of the net and the other party near the symbol pin or the layer-to-layer relay via and prints it legibly as a logical drawing, in relation to the net connection which is connected by using a plurality of layers (Step 308).

The logical mounting drawing and the pass tracking diagram will become a complete logical mounting circuit diagram if only the PCB circuit has the both sides, since the logical connection information and the part-mounting-position-information are displayed simultaneously. The drawing printing unit 31 can also print the pattern diagram which only has a wiring layer of the internal layers as occasion demands.

Further, the pass tracking circuit diagram which is capable of tracking the whole signal flow from the input to the output smoothly is the most ideal in the logical simulation and the delay analysis of the signal. For this reason, the drawing printing unit 31 also can prepare the drawing which is accommodated to the flow of the pass of the signal.

Figure 16:
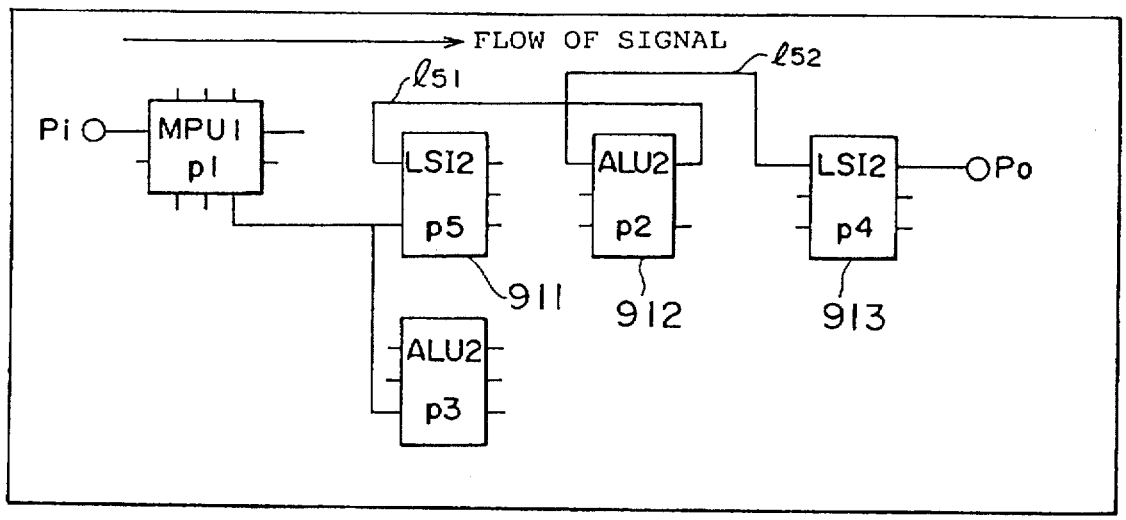
FIG. 16 is a diagram indicating a pass tracking circuit diagram of the embodiment 3.

For instance, in the pass tracking circuit diagram shown in FIG. 16, the signal is inputted to the ALU 912 passing through from the LSI 911 to the wiring 51. Further, it will be understood that the signal is inputted to the LSI 913 passing through from the ALU 912 to the wiring 52.

It is difficult to display such pin names as the high density symbol and a lot of information like the signal kind name at the same time on the screen. For this reason, in the third embodiment, for instance, the library preparation unit 24a takes out the detailed information 715 of the designated parts within the library preparation screen 71 shown in FIG. 11 from the part library 54.

Figure 17:
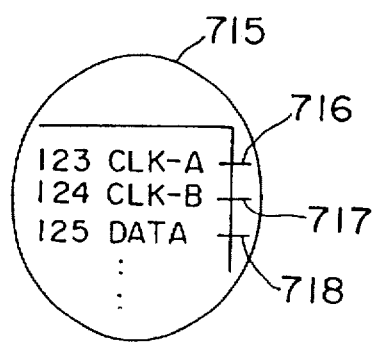
FIG. 17 is a diagram indicating the display example of the partial detailed information of ALU of the embodiment 3.

Then, the library preparation unit 24a can enlarge the detailed information 715 of the designated parts in accordance with the operator's instructions and can display the information 716, 717 and 718 on the screen in a minute, as shown in FIG. 17.

(11) Logical Verification

The verification unit 34 executes the analysis of the logical simulation, the signal delay and the crosstalk noise (Step 309). The process control unit 23a returns the processing to the wiring processing or the logical input processing and the part arrangement processing, in accordance with the verification result(Step 310).

Besides, the processing from the processing of the PCB shape designating unit 25a to the processing of the wiring processing unit 29a can be executed in irregular order. The additional processing or the change processing can be executed as occasion demands. The above-mentioned processing result is linked to the unillustrated manufacturing-data-preparation system.

Further, although the logical verification was executed after the printing processing of the drawing was executed in the third embodiment for instance, the printing processing of the drawing can be executed after the logical verification is executed.

As mentioned hereinbefore, according to the third embodiment, the library preparation unit 24a prepares the part symbol in which the logical function information indicating the logical function elements and the mounting information including the shape and the size of the parts are defined on the whole. The PCB shape processing unit 25a sets the outline frame of the printed circuit board.

The part symbol arrangement designating unit 26a inputs the logical function information in the outline frame of the printed circuit board by using the part symbol, and designates positions of the parts. The net connection designating unit 27a designates the wiring connection relation among each of the parts by adding the logical connection information for connecting each of the logical function elements one another to the part symbol.

Namely, the logical design and the mounting of the parts are executed at the same time within the outline frame of the printed circuit board using the part symbol. The wiring route among the parts will be designated at the same time if the logical connection information is added to the part symbol.

Accordingly, the design manhours of the printed circuit board can be reduced, since the mounting of the parts are executed simultaneously from the logical design stage.

The PCB shape processing, the logical input, the part arrangement and the wiring pattern processing are executed for the second time as occasion demands. Namely, such complicated design changes as the material grasp of the mounted parts and the changing of the operational shape can be executed flexibly, since the arrangement of the parts and the shape of the printed circuit board are changed dynamically in the actual size.

Further, the PCB shape processing unit 25a sets the prohibition area which prohibits the arrangement of the parts in the outline frame of the printed circuit board displayed on the screen. The part symbol arrangement designating unit 26a designates the schematic arrangement range of the part symbol displayed on the screen. Namely, the delay condition of the signal can be confirmed in its early stage, since the arrangement of the parts is executed step by step from the early stage of the design.

The net connection designating unit 27a designates the schematic wiring route when the wiring is restricted, and adds the logical connection information to the part symbol when the wiring is not restricted. Namely, the net connection designating unit 27a executes the gradual designation of the wiring pattern shape. For this reason, the delay condition of the signal can be confirmed in its early stage, in accordance with the shape of the wiring pattern.

Further, the logical information and the mounting information can be retrieved at a high speed, since the logical information and the mounting information are stored in the fusion database 52a by making them correspond one another. Besides, the information management accompanying the change of the logical design can be easily executed, since the drawing printing unit 31 prints the drawing in which the logical circuit diagram and the arrangement wiring diagram are unified. The logical simulation and the delay analysis of the signal can be easily executed, since the drawing printing unit 31 prepares the logical circuit diagram.

What is claimed is:

1. A system for mounting and designing printed boards which designs a mounting construction of a printed circuit board by making parts corresponding to each of a plural logical function elements which forms a logical circuit correspond to the printed circuit board, comprising:

preparation means for preparing a part symbol in which a logical function information indicating the logical function elements and a mounting information including a shape and a size of the parts are defined on the whole;

shape processing means for setting an outline frame of the printed circuit board;

displaying means for displaying the outline frame of the printed circuit board set by said shape processing means and the part symbol prepared by said preparation means on the screen;

arrangement designating means for inputting the logical function information in the outline frame of the printed circuit board of the screen by using the part symbol displayed in said displaying means and designating positions of the parts; and connection designating means for designating a wiring connection relation among each of the parts by adding a logical connection information indicating a connection among each of the logical function elements to the part symbol displayed in said displaying means.

2. A system for mounting and designing printed boards according to claim 1, further comprising:

process control means for executing at least one of the processes of said shape processing means, the processes of said arrangement designating means and the processes of said connection designating means repeatedly.

3. A system for mounting and designing printed boards according to claim 1,
wherein said shape processing means sets a prohibition area which prohibits the arrangement of the parts within the outline frame of the printed circuit board displayed on the screen, and
said arrangement designating means designates a schematic arrangement range of the part symbol displayed on the screen.

4. A system for mounting and designing printed boards according to claim 1,
wherein said connection designating means designates a schematic wiring route when the wiring is restricted and adds the logical connection information to the part symbol when the wiring is not restricted.

5. A system for mounting and designing printed boards according to claim 1, further comprising:
storage means for storing the logical function information, the logical connection information and the mounting information by making them correspond one another.

6. A system for mounting and designing printed boards according to claim 1, further comprising:
drawing printing means for preparing and printing a drawing in which a logical circuit diagram and an arrangement wiring diagram are unified on the basis of the part symbol and the logical connection information.

7. A system for mounting and designing printed boards according to claim 6,
wherein said drawing printing means prepares a logical circuit diagram in which the arrangement and the wiring of the parts are executed following a signal flow from input to output.

8. A method for mounting and designing printed boards which designs a mounting construction of a printed circuit board by making parts corresponding to each of a plural logical function elements which forms a logical circuit correspond to the printed circuit board, comprising:
a preparation step for preparing a part symbol in which a logical function information indicating the logical function elements and a mounting information including a shape and a size of the parts are defined on the whole;
a shape processing step for setting an outline frame of the printed circuit board;
a displaying step for displaying the outline frame of the printed circuit board which was set and the prepared part symbol on the screen;
an arrangement designating step for inputting the logical function information in the outline frame of the printed circuit board of the screen by using the displayed part symbol and designating positions of the parts; and
a connection designating step for designating a wiring connection relation among the parts by adding a logical connection information indicating a connection among each of the logical function elements to the displayed part symbol.

9. A method for mounting and designing printed boards according to claim 8, further comprising:

a process control step for executing at least one of the processes of the shape processing step, the processes of the arrangement designating step and the processes of the connection designating step repeatedly.

10. A method for mounting and designing printed boards according to claim 8,
wherein the shape processing step sets a prohibition area which prohibits the arrangement of the parts within the outline frame of the printed circuit board displayed on the screen, and
the arrangement designating step designates a schematic arrangement range of the part symbol displayed on the screen.

11. A method for mounting and designing printed boards according to claim 8,
wherein the connection designating step designates a schematic wiring route when the wiring is restricted and adds the logical connection information to the part symbol when the wiring is not restricted.

12. A method for mounting and designing printed boards according to claim 8, further comprising:
a storage step for storing the logical function information, the logical connection information and the mounting information by making them correspond one another.

13. A method for mounting and designing printed boards according to claim 8, further comprising:
a drawing printing step for preparing and printing a drawing in which a logical circuit diagram and an arrangement wiring diagram are unified on the basis of the part symbol and the logical connection information.

14. A method for mounting and designing printed boards according to claim 13,
wherein said drawing printing step prepares a logical circuit diagram in which the arrangement and the wiring of the parts are executed following a signal flow from input to output.

15. A system for mounting and designing printed boards by making parts corresponding to each of a plural logical function elements form a logical circuit corresponding to the printed circuit board, the system comprising:
a preparation unit preparing a part symbol in which a logical function information indicating the logical function elements and a mounting information including a shape and a size of the parts;
a shape processing unit setting an outline frame of the printed circuit board;
a display displaying the outline frame of the printed circuit board set by said shape processing unit and the part symbol prepared by said preparation unit on a screen;
an arrangement designating unit inputting the logical function information in the outline frame of the printed circuit board on the screen by using the part symbol displayed in said display and designating positions of the parts; and
a connection designating unit designating a wiring connection relation among each of the parts by adding logical connection information indicating a connection among each of the logical function elements to the part symbol displayed in said display.

* * * * *

UNITED STATES PATENT AND TRADEMARK OFFICE
CERTIFICATE OF CORRECTION

PATENT NO. : 5,745,371
DATED : April 28, 1998
INVENTOR(S) : Shouen

It is certified that error appears in the above-identified patent and that said Letters Patent is hereby corrected as shown below:

Col. 10, line 34, change "23a" to --24a--.
Col. 12, line 31, change "11," to --$\ell$1,--; change "12," to --$\ell$2,--;
        line 32, change "13" to --$\ell$3--.
Col. 13, line 50, change "111-114" to --$\ell$11-$\ell$14--;
        line 51, change "121-129" to --$\ell$21-$\ell$29--.
Col. 15, line 41, change "embodiment" to --embodiment,--.

Signed and Sealed this

Fourth Day of August, 1998

Attest:

BRUCE LEHMAN

Attesting Officer     Commissioner of Patents and Trademarks